United States Patent
Ramm et al.

(10) Patent No.: US 6,548,391 B1
(45) Date of Patent: Apr. 15, 2003

(54) METHOD OF VERTICALLY INTEGRATING ELECTRIC COMPONENTS BY MEANS OF BACK CONTACTING

(75) Inventors: Peter Ramm, Pfaffenhofen (DE); Armin Klumpp, Munich (DE)

(73) Assignee: Fraunhofer-Gesellschaft zur Foerderung der Angewandten Forschung E. V., Munich (DE)

( * ) Notice: Subject to any disclaimer, the term of this patent is extended or adjusted under 35 U.S.C. 154(b) by 0 days.

(21) Appl. No.: 09/979,826

(22) PCT Filed: May 16, 2000

(86) PCT No.: PCT/DE00/01605

§ 371 (c)(1), (2), (4) Date: Mar. 18, 2002

(87) PCT Pub. No.: WO00/74134

PCT Pub. Date: Dec. 7, 2000

(30) Foreign Application Priority Data

May 27, 1999 (DE) .......................................... 199 24 287
Dec. 4, 1999 (DE) .......................................... 199 58 486

(51) Int. Cl.[7] .............................................. H01L 21/44
(52) U.S. Cl. ...................... 438/611; 438/455; 438/456
(58) Field of Search ................................ 438/455–456, 438/611–617

(56) References Cited

U.S. PATENT DOCUMENTS 4,939,568 A  7/1990  Kato et al. ..................... 357/75
5,426,072 A  6/1995  Finnila (List continued on next page.)

FOREIGN PATENT DOCUMENTS

DE  44 30 812 C1  9/1995
DE  44 33 846 C2  3/1996
DE  198 16 245 a1  10/1999

(List continued on next page.)

OTHER PUBLICATIONS

Akasaka, Y., "Three–Dimensional IC Trends," *Proceedings of the IEEE*, vol. 74, No. 12, Dec. 1986, pp. 1703–1714.
Hayashi, Y., et al., "Cumulatively Bonded IC (Cubic) Technology For 3D–IC Fabrication," 8th International Workshop on Future Electron Devices, Mar. 14–16, 1990, pp. 85–88.

*Primary Examiner*—Tuan H. Nguyen
*Assistant Examiner*—Thanh Nguyen
(74) *Attorney, Agent, or Firm*—Glenn Patent Group; Michael A. Glenn

(57) ABSTRACT

The present invention relates to a method of connecting two semiconductor components comprising the steps of providing in a first main surface of a first semiconductor substrate first component structures including first contact areas, forming in said first semiconductor substrate via holes filled with electrically conductive material and electrically insulated from said first semiconductor substrate, said via holes extending down to the second main surface of the first semiconductor substrate and being connected in an electrically conductive manner to said first contact areas via an electrically conductive connection material on the first main surface of said first semiconductor substrate, forming on the second main surface of the first semiconductor substrate first lands which are connected in an electrically conductive manner to the first contact areas via the electrically conductive material in the via holes, providing on a second semiconductor substrate second component structures including second contact areas, forming second lands which are connected in an electrically conductive manner to the second contact areas, and connecting the first and the second semiconductor substrate in such a way that the electrical as well as the mechanical connection between the two substrates is established via the first and the second lands. By repeating the above-mentioned steps an arbitrary number of times, a three-dimensional integrated circuit can be produced by the method according to the present invention.

13 Claims, 2 Drawing Sheets

U.S. PATENT DOCUMENTS

| | | |
|---|---|---|
| 5,563,084 A | 10/1996 | Ramm et al. |
| 5,627,106 A | 5/1997 | Hsu .......................... 438/459 |
| 5,767,001 A | 6/1998 | Bertagnolli et al. ........ 438/455 |
| 5,846,879 A | 12/1998 | Winnerl et al. ............. 430/666 |
| 6,187,652 B1 * | 2/2001 | Chou et al. ................. 257/698 |

FOREIGN PATENT DOCUMENTS

| | | |
|---|---|---|
| DE | 198 13 239 C1 | 12/1999 |
| EP | 0 531 723 A1 | 3/1993 |
| EP | 0 559 366 A1 | 9/1993 |
| EP | 0 926 726 A1 | 6/1999 |
| JP | 63-156348 | 6/1988 |

* cited by examiner

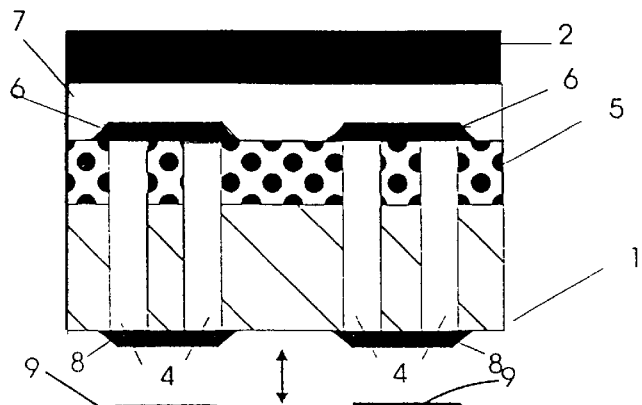
FIG. 2a
FIG. 2b
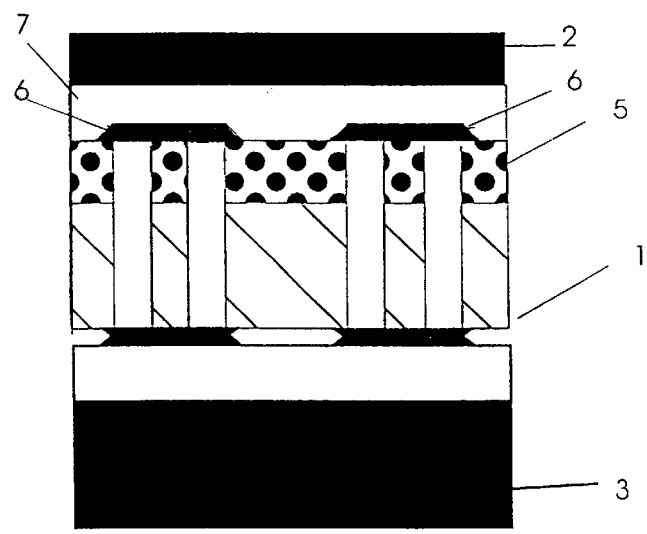
FIG. 3
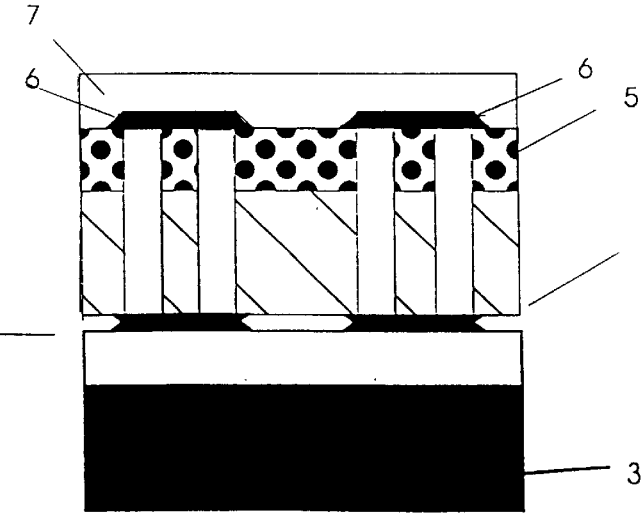
FIG. 4

METHOD OF VERTICALLY INTEGRATING ELECTRIC COMPONENTS BY MEANS OF BACK CONTACTING

FIELD OF THE INVENTION

The present invention relates to a method of producing a three-dimensional integrated circuit.

BACKGROUND OF THE INVENTION AND PRIOR ART

Three-dimensional integration means that components produced by means of planar technology are connected vertically. The advantages of a three-dimensionally integrated microelectronic system are e.g. that, in comparison with two-dimensional systems, higher packaging densities and switching speeds can be achieved on the basis of the same design rules. The latter is due to shorter conduction paths between the individual components or circuits on the one hand, and to the possibility of parallel information processing on the other. An optimum increase in the efficiency of the system is achieved, when a connection technology with locally freely selectable vertical contacts, which are suitable for very-large scale integration, is realized.

For producing three-dimensional circuit arrangements with freely selectable vertical contacts, the following methods are known, among others.

In Y. Akasaka, Proc. IEEE 74 (1986) 1703, it is e.g. suggested that polycrystalline silicon should be deposited on a fully processed component layer and that this polycrystalline silicon should be recrystallized so that additional components can be produced in the recrystallized layer. Disadvantages of this method are the yield-reducing degradation of the lower-level components due to the high thermal load during the recrystallization process and the necessarily serial processing of the overall system. The latter causes, on the one hand, comparatively long cycle times in the production process and, on the other hand, it causes a reduction of yield due to the fact that process-dependent outage times add up. Both factors increase the production costs to a substantial extent in comparison with a processing of the individual planes separately from one another in different substrates.

Y. Hayashi et al., Proc. $8^{th}$ Int. Workshop on Future Electron Devices, 1990, p. 85, additionally discloses that the individual component planes are first produced separately from one another in different substrates. Subsequently, the substrates are thinned, provided with contacts on the front and on the back, and vertically connected by means of a bonding process. This method is advantageous insofar as the vertical integration is finished when the bonding process has been finished, i.e. it is no longer necessary to execute any processing steps at the stacked substrates. The applicability of this method is, however, strongly limited by the circumstance that the substrates must here be thinned down to a few 0.1 µm (complete removal of the substrate material in the area of the lateral insulating structures), so that this method cannot be used for vertically integrating components which have been produced according to standard semiconductor technologies.

U.S. Pat. No. 4,939,568 describes a method for producing a three-dimensional, integrated circuit structure by stacking individual integrated circuits on a support substrate so as to obtain a stack of individual chips. For this purpose, a substrate with fully processed integrated circuits is first subdivided into individual chips, whereby processing at the wafer level is finished. The chips are tested, and a first individual chip is applied to a support substrate by means of thermocompression. After this step, a further chip is applied to the first chip in the same way. Hence, a first stack of chips is finished before the production of another stack of chips on a further support substrate is started. It follows that further processing of the stacks of chips at the wafer level is not possible by means of this method.

A significant disadvantage of the hitherto mentioned methods results from the fact that the devices available in the field of silicon technology only permit a processing of disk-shaped substrates, the so-called wafers. Substrates other than disk-shaped substrates, especially individual chips, can only be processed in experimental plants, but not within the framework of industrial production with the high yields demanded.

U.S. Pat. No. 5,563,084 describes a method of producing a three-dimensional integrated circuit in the case of which the connection of the individual component planes is established via specially formed via holes. According to this method, two fully processed substrates are connected. Prior to connecting the substrates, the upper substrate is, however, subjected to a functional test by means of which the chips of the substrate that are intact are selected. Subsequently, the substrate is thinned from the back, divided into individual chips and only selected chips that are intact are applied in an aligned, side-by-side mode of arrangement to the lower substrate which is provided with an adhesive layer. This method is, however, disadvantageous insofar as the vertical electric connections between the stacked component planes are realized only subsequently by further processing at the wafer level (wiring). For this purpose, it will, on the one hand, be necessary to use a suitable planarization method, which levels the marked topography of the chip stacks, so that these chip stacks can be processed according to standard disk production processes. On the other hand, the integration density of the final wiring is additionally limited due to the finite positioning accuracy in the chip application process. The lithographic steps executed at the disk level, which are necessary for opening via holes to the metallization plane of the chip applied and for subsequently patterning the final wiring plane, must take into account suitable alignment tolerances so as to be in the "registering range" throughout the whole area of the wafer.

U.S. Pat. No. 5,627,106 additionally discloses a method of three-dimensionally connecting semiconductor components in the case of which semiconductor component structures are produced in and on the upper surface of a first semiconductor substrate. Subsequently, deep trenches are etched into the first semiconductor substrate and filled with a conductive material. Following this, the back of the first semiconductor substrate is ground off and polished so that the trenches filled with conductive material will project. Also the second semiconductor substrate is provided with semiconductor component structures. In addition, connection windows are etched into the second semiconductor substrate, the projecting trenches of the first semiconductor component the projecting trenches of the first semiconductor component being fitted into said windows in a subsequent step. Only after the mechanical connection of the two substrates, are the semiconductor component structures of the first semiconductor substrate connected in an electrically conductive manner to the conductive material in the trenches. A special disadvantage of this method is that the projecting trenches filled with conductive material tend to break off, which makes it more difficult to handle the method in practice.

German patent specification DE 44 33 846 additionally describes a method of producing a vertical integrated circuit structure in the case of which the individual component layers are processed independently of one another in different substrates and joined subsequently. For this purpose, via holes, which extend through all the component layers provided, are first opened at the front of a fully processed top substrate. Following this, a handling substrate is applied and the top substrate is thinned from the back down to the via holes. Finally, a fully processed bottom substrate is connected to the top substrate. After the removal of the handling substrate, the via holes are extended through the remaining layers down to a metallization plane of the bottom substrate, and the electric contact between the top and the bottom substrate is established.

The post-published EP-A-0 926 726 additionally discloses a method of applying diced chips to printed circuit boards. According to this method, the component structures located on the front of the chips are electrically and mechanically connected to electric contacts on the printed circuit board through via holes extending through the chips.

The EP-A-0 531 723 additionally discloses a method of three-dimensionally stacking semiconductor chips. According to this method, the electric connection is realized by a non-high-fusion soldered joint, and the mechanical connection between the chips and the substrate is established via polyimide or via some other connection layer. It follows that the mechanical stability of the stack of chips which has already been formed will not deteriorate when the stack is re-heated so as to apply a further chip.

Hence, this known method is problematic insofar as, firstly, it is difficult to level a chip surface consisting of polyimide on the one hand, and of solder material filled in the trenches on the other. Secondly, a chip surface consisting of a plurality of juxtaposed different materials has different thermal properties which will have an unfavourable effect when the stack of chips is repeatedly heated so as to apply new chips again and again.

U.S. Pat. No. 5,426,072 discloses a method of producing a three-dimensional integrated circuit from stacked SOI wafers making use of a temporary silicon substrate. For this purpose, an SOI substrate is processed such that it has through-holes formed therein, which extend through the silicon layer of the SOI substrate and which are extended through the insulator later on. The substrate of the SOI wafer is removed, whereupon both sides of the through-holes are provided with indium bumps. A further substrate is produced which is provided with indium bumps as well. The two substrates are placed on top of one another in such a way that the indium bumps are in contact, whereupon a cold-welding method is used so as to fuse the indium bumps. The space existing between the bumps is filled with an epoxy resin adhesive so as to provide a mechanical support for the connection between the upper and the lower substrate.

SUMMARY OF THE INVENTION

It is the object of the present invention to provide an improved method of connecting two semiconductor components, a method of connecting a plurality of semiconductor components as well as a stack of semiconductor components which is produced by means of such a method.

In accordance with a first aspect of the present invention, this object is achieved by a method of connecting two semiconductor components comprising the steps of providing in a first main surface of a first semiconductor substrate first component structures including first contact areas; forming in said first semiconductor substrate via holes filled with electrically conductive material and electrically insulated from said first semiconductor substrate, said via holes extending down to a second main surface of the first semiconductor substrate and being connected in an electrically conductive manner to said first contact areas via an electrically conductive connection material ; forming on the second main surface of the first semiconductor substrate first lands which are connected in an electrically conductive manner to the first contact areas via the electrically conductive material in the via holes; providing a second semiconductor substrate having second component structures including second contact areas; forming second lands which are connected in an electrically conductive manner to the second contact areas; connecting the first and the second semiconductor substrate in such a way that an electrically conductive as well as a mechanically stable connection between the two substrates is established exclusively via the first and the second lands In accordance with a second aspect of the present invention, this object is achieved by a method of connecting a plurality of semiconductor components, wherein a method of connecting two semiconductor components is repeated iteratively, the method of connecting two semiconductor components having the following steps: providing in a first main surface of a first semiconductor substrate first component structures including first contact areas; forming in said first semiconductor substrate via holes filled with electrically conductive material and electrically insulated from said first semiconductor substrate, said via holes extending down to a second main surface of the first semiconductor substrate and being connected in an electrically conductive manner to said first contact areas via an electrically conductive connection material ; forming on the second main surface of the first semiconductor substrate first lands which are connected in an electrically conductive manner to the first contact areas via the electrically conductive material in the via holes; providing a second semiconductor substrate having second component structures including second contact areas; forming second lands which are connected in an electrically conductive manner to the second contact areas; and connecting the first and the second semiconductor substrate in such a way that an electrically conductive as well as a mechanically stable connection between the two substrates is established exclusively via the first and the second lands; and wherein the respective nth semiconductor component plays the part of the first semiconductor component, and the stack of (n−1) combined semiconductor components plays the part of the second semiconductor component.

Hence, the present invention provides a method of connecting two semiconductor components which comprises the steps of providing in a first main surface of a first semiconductor substrate first component structures including first contact areas, forming in said first semiconductor substrate via holes filled with electrically conductive material and electrically insulated from said first semiconductor substrate, said via holes extending down to the second main surface of the first semiconductor substrate and being connected in an electrically conductive manner to said first contact areas via an electrically conductive connection material on the first main surface of said first semiconductor substrate, forming on the second main surface of the first semiconductor substrate first lands which are connected in an electrically conductive manner to the first contact areas via the electrically conductive material in the via holes, providing on a second semiconductor substrate second component structures including second contact areas, forming second lands which are connected in an electrically conductive manner to the second contact areas, and connecting the first and the second semiconductor substrate in such a way that the electrical as well as the mechanical connection between the two subs strates is established via the first and the second lands.

According to the present invention, a stack of semiconductor components is additionally provided, which has been produced by combining 2 or more semiconductor components making use of the method as defined hereinbefore.

In accordance with the method according to the present invention, two fully processed substrates, which each comprise circuit structures and heavily doped connection areas and/or metallization planes, are connected to one another via metallic layers. In the case of the upper substrate a back wiring of the type known e.g. from the still unpublished German patent application DE 198 16 245.6 is first provided, whereby electric connections are established between first contact areas, e.g. heavily doped connection areas or metallization planes of the component layer, and the back of the component substrate (back contacts). The lower substrate is provided with correspondingly positioned metallic front contacts so that, by means of a suitable bonding method, vertical mechanical and electrical connections can be realized between the back contacts of the upper substrate and the front contacts of the lower substrate.

The method according to the present invention is advantageous insofar as, due to the fact that vertical mechanical and electrical connections are realized between the upper and the lower substrate by means of a suitable bonding method, it is not necessary to apply any separate layer, such as a polyimide layer, for mechanically connecting the upper and the lower substrate. It follows that, in contrast to the prior art, the step of levelling this connection layer with the solder system, which proved to be difficult in practice, can also be dispensed with in the case of the method according to the present invention. If the mechanical connection layer and the solder system have not been levelled correctly, it may happen that the solder systems of the upper substrate and of the lower substrate are not in sufficient contact with one another so that no reliable electric connection will be established between the upper and lower substrates. The use of a mechanical connection layer is also disadvantageous insofar as the mechanical and the electrical connection material have different thermal properties. When two substrates are joined with an increase in temperature, one material will already be soft, whereas the other material will still be solid. This makes the process of joining even more complicated.

The bonding method used in accordance with the present invention can be executed e.g. according to a classic soft-soldering process or according to a low-temperature soldering process, which is based on the "solid-liquid interdiffusion" of two metals and which permits the formation of connections which are stable up to a temperature that is much higher than the bonding temperature. It follows that, during bonding, a eutectic alloy will form whose melting point after the joining process will be higher than the melting points of the individual components prior to the joining process. Hence a connection is formed, which is irreversible insofar as it is stable with respect to the conditions under which it has been established previously. Examples for combinations of metals which can be used for electrical and mechanical connections according to the present invention are copper and tin or gold and titanium for the respective front and back contacts.

According to the present invention, also a further component layer can be applied chipwise in the same way, without rendering the previously applied component layers instable. In so doing, the hitherto formed stack of components and the associated substrate serve as a new lower substrate. Hence, the number of planes is not limited in the case of this method. In addition, it is possible to apply not only an individual plane but also a sub-stack, such as an individual chip, which already comprises a plurality of planes.

It goes without saying that the present invention also offers the possibility of using the above-mentioned solder system only as an adhesive at certain locations, i.e. that the contacts established thereby are only mechanical but not electrical contacts.

Suitable substrates are monocrystalline silicon substrates, SOI substrates or substrates of different technological families, such as e.g. III-V-semiconductors.

BRIEF DESCRIPTION OF THE DRAWINGS

In the following, preferred embodiments of the present invention will be explained in detail making reference to the drawings enclosed, in which:

FIGS. 2a and 2b illustrate exemplarily how the upper and the lower substrate are joined;

FIG. 3 shows the joined stack comprising the upper and the lower substrate; and

FIG. 4 shows the joined stack comprising the upper and the lower substrate, after the removal of the auxiliary substrate.

DETAILED DESCRIPTION OF PREFERRED EMBODIMENTS

Figure 1A:
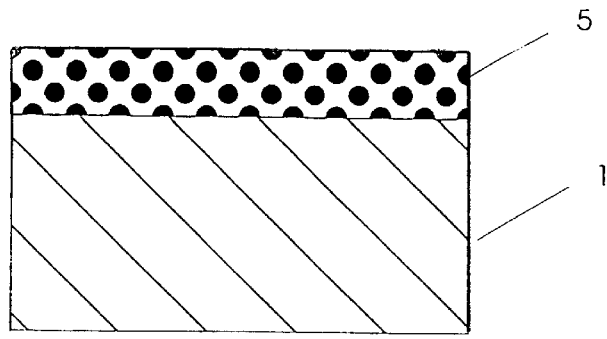
FIGS. 1a to 1d show exemplarily a processing sequence for the upper substrate.
Figure 1B:
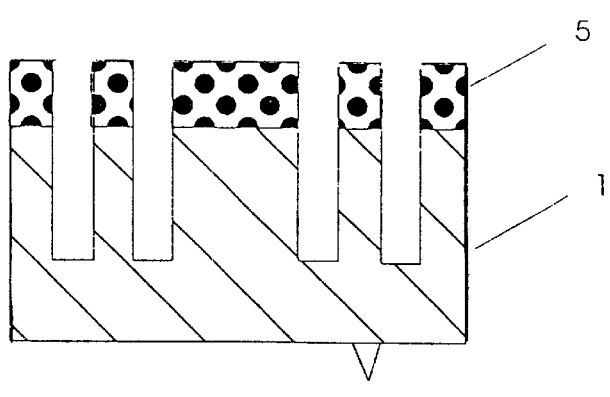
Figure 1C:
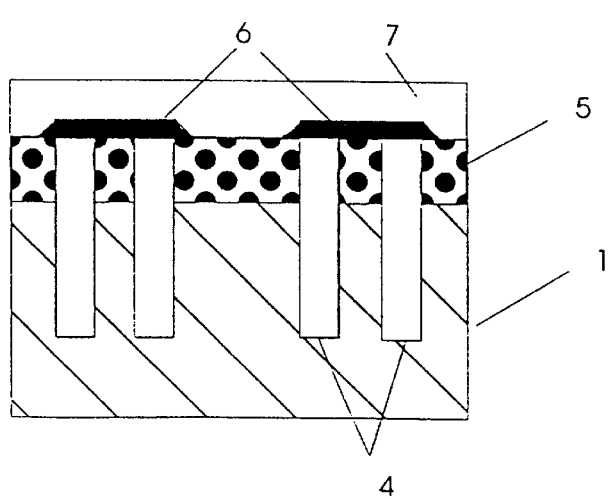

In FIG. 1a to 1d, reference numeral 1 designates the upper substrate. After a preparatory processing of the upper substrate, the via holes 4, so-called deep vias, i.e. vertically integrated connections, with an aspect ratio of depth to diameter of up to 50:1, are formed in the upper substrate. The via holes 4 are normally formed through the oxide layers 5 on the substrate surface. The surface of the via holes is lined with an insulating layer, e.g. silicon dioxide, and an adhesive layer and a diffusion barrier, e.g. titanium nitride. Subsequently, the via holes are filled with an electrically conductive material, e.g. copper or tungsten, such that a formation of cavities will be avoided. After areal etching back, insulated, electrically conductive and filled via holes 4 are obtained, which, by means of subsequent metallization steps, are connected to one another and to the electrically active regions, e.g. heavily doped regions or metallization planes, of the electronic circuit according to the requirements of the electronic circuit. When the metallization 6 has been provided, a passivating and protective layer 7 is deposited.

Figure 1D:
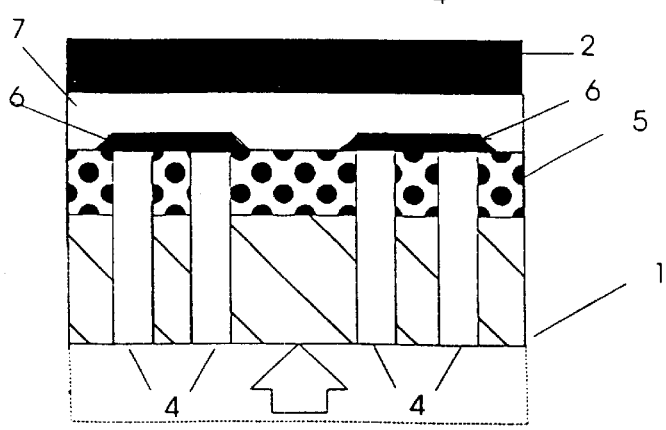

As can be seen in FIG. 1d, the upper substrate is then glued onto an auxiliary substrate 2 used as a mechanical support, and thinned from the back until the filled via holes are exposed from the back. Typical thicknesses of the thinned upper substrate are approx. 10 $\mu$m. The back is then provided with first lands 8, as shown in FIG. 2a, by the sequence of processing steps: depositing an insulating material, depositing an adhesive layer, opening this combination of layers in the area of the via holes, applying a metallization and patterning. These lands 8 are therefore connected to the electrically active regions on the front through the via holes 4. Parallel to the processing of the upper substrate 1, the lower substrate 3 is provided with second lands 9, as shown in FIG. 2b, the second lands 9 being arranged in a mirror-inverted mode of arrangement relative to the first lands 8 on the back of the thinned upper substrate so that, when the upper substrate is placed onto the lower substrate such that it is in alignment therewith, the lands 8, 9 will touch one another in pairs, as can be seen in FIG. 3. Typical diameters of the lands touching one another are approx. 5 μm. These small diameters result from the high aspect ratio of the via holes 4.

The alignment can be effected making use of alignment marks consisting of suitably arranged via hole rows. Both the first and the second lands are preferably implemented in a combination of materials which permits the production of electrically conductive and mechanically stable connections by an increase in temperature during contacting; this contacting is normally carried out such that a mechanical force is applied simultaneously. These combinations of materials can preferably be combinations of the type used for classic soft-soldering, or they can preferably be combinations in the case of which a connection is established by interdiffusion. This can, in particular, be realized by a combination of copper on the lower substrate and tin on the back of the upper substrate. When the upper substrate 1 and the lower substrates 3 have been connected, the auxiliary substrate 2 can be removed and the stack of substrates now obtained can be cleaned.

According to a preferred embodiment, it is now possible to connect the resultant stack of substrates with additional component substrates. In so doing, the resultant stack of substrates is used as the lower substrate which is subjected to further processing, as can be seen in FIGS. 4 and 2b; for such further processing, it will first be necessary to expose the protective layer 7 so as to expose the upper metallization 6.

What is claimed is:

1. A method of connecting two semiconductor components comprising the steps of providing in a first main surface of a first semiconductor substrate first component structures including first contact areas;

forming in said first semiconductor substrate via holes filled with electrically conductive material and electrically insulated from said first semiconductor substrate, said via holes extending down to a second main surface of the first semiconductor substrate and being connected in an electrically conductive manner to said first contact areas via an electrically conductive connection material;

forming on the second main surface of the first semiconductor substrate first lands which are connected in an electrically conductive manner to the first contact areas via the electrically conductive material in the via holes;

providing a second semiconductor substrate having second component structures including second contact areas;

forming second lands which are connected in an electrically conductive manner to the second contact areas;

connecting the first and the second semiconductor substrate in such a way that an electrically conductive as well as a mechanically stable connection between the two substrates is established exclusively via the first and the second lands.

2. A method according to claim 1, wherein the contact areas are heavily doped connecting areas.

3. A method according to claim 1, wherein the contact areas are metallization planes.

4. A method according to claim 3, wherein the contact areas are metallization planes arranged on the first main surface.

5. A method according to claim 3, wherein the contact areas are metallization planes arranged below the first main surface.

6. A method according to claim 1, wherein the electrically conductive connection material is applied via an additional metallization sequence.

7. A method according to claim 1, wherein, after the formation of the via holes, the first main surface of the first semiconductor substrate is connected to an auxiliary substrate and is then thinned from the side of the first semiconductor substrate located opposite said first main surface.

8. A method according to claim 1, wherein the first and the second semiconductor substrate are first subjected to identical processing steps and are then joined in a mirror-inverted mode of arrangement.

9. A method according to claim 1, wherein the materials used for the first and the second land are chosen such that the compound of the first and second lands, which results from the connecting step, has a melting point which is higher than the melting points of the materials of the first and second land prior to the connecting step.

10. A method according to claim 9, wherein the materials for the first and the second land are chosen such that they will form a eutectic compound.

11. A method according to claim 1, wherein not all the first and second lands are connected in an electrically conductive manner to respective ones of the first and second contact areas.

12. A method according to claim 1, wherein an electrically conductive connection is established by placing the second main surface of the first semiconductor substrate onto the surface of the second semiconductor substrate in an aligned mode of arrangement, with a simultaneous increase in temperature and application of force.

13. A method of connecting a plurality of semiconductor components, wherein a method of connecting two semiconductor components is repeated iteratively, the method of connecting two semiconductor components having the following steps:

providing in a first main surface of a first semiconductor substrate first component structures including first contact areas;

forming in said first semiconductor substrate via holes filled with electrically conductive material and electrically insulated from said first semiconductor substrate, said via holes extending down to a second main surface of the first semiconductor substrate and being connected in an electrically conductive manner to said first contact areas via an electrically conductive connection material;

forming on the second main surface of the first semiconductor substrate first lands which are connected in an electrically conductive manner to the first contact areas via the electrically conductive material in the via holes;

providing a second semiconductor substrate having second component structures including second contact areas;

forming second lands which are connected in an electrically conductive manner to the second contact areas; and connecting the first and the second semiconductor substrate in such a way that an electrically conductive as well as a mechanically stable connection between the two substrates is established exclusively via the first and the second lands; and wherein the respective nth semiconductor component plays the part of the first semiconductor component, and the stack of (n−1) combined semiconductor components plays the part of the second semiconductor component.

* * * * *